United States Patent [19]

Mizuno et al.

[11] 4,217,151

[45] Aug. 12, 1980

[54] CERMET TYPE MAGNETIC MATERIAL

[75] Inventors: Hideaki Mizuno; Susumu Terawaki, both of Yokohama, Japan

[73] Assignee: Victor Company of Japan, Limited, Yokohama, Japan

[21] Appl. No.: 6,895

[22] Filed: Jan. 26, 1979

[30] Foreign Application Priority Data

Jan. 27, 1978 [JP] Japan .................................. 53/8119

[51] Int. Cl.$^2$ ............................................ C04B 35/00
[52] U.S. Cl. ............................ 148/31.55; 75/0.5 AC;
75/0.5 BC; 75/232; 75/235
[58] Field of Search ............ 75/123 R, 123 L, 123 B,
75/126 H, 126 R, 235, 0.5 AC, 0.5 BC, 232;
148/31.55, 31.57; 427/132, 128, 248 C, 250,
255; 428/564, 432, 433, 900

[56] References Cited

U.S. PATENT DOCUMENTS

| | | | |
|---|---|---|---|
| 3,152,389 | 10/1964 | Alexander et al. | 75/235 |
| 3,317,285 | 5/1967 | Alexander et al. | 75/235 |
| 3,630,723 | 12/1971 | Asada | 75/128 W |
| 3,719,519 | 3/1973 | Perugini | 428/564 |
| 3,844,773 | 10/1974 | Yamakoshi et al. | 75/123 L |
| 3,864,093 | 2/1975 | Wolfla | 428/564 |
| 3,948,649 | 4/1976 | Tokahoshi et al. | 75/126 R |
| 4,115,111 | 9/1978 | Itoh et al. | 75/126 R |
| 4,124,737 | 11/1978 | Wolfla et al. | 75/235 |

FOREIGN PATENT DOCUMENTS

| | | | |
|---|---|---|---|
| 39-12231 | 7/1964 | Japan | 75/123 L |
| 48-57807 | 8/1973 | Japan | 75/235 |

*Primary Examiner*—R. Dean
*Assistant Examiner*—John P. Sheehan
*Attorney, Agent, or Firm*—Lowe, King, Price & Becker

[57] ABSTRACT

A cermet type magnetic material whose essential components are Fe, Co and/or Ni and an oxide ceramic such as SiO, $Al_2O_3$, $SiO_2$, MgO or $TiO_2$. This material features large hardness, high saturation magnetic induction, low coercive force and good durability and can readily be produced in the form of thin film on a substrate. Optionally this magnetic material may additionally comprise at least one of Si, B, P and C, or Cr and/or Mn.

3 Claims, 4 Drawing Figures

CERMET TYPE MAGNETIC MATERIAL

BACKGROUND OF THE INVENTION

This invention relates to a novel magnetic material which is of cermet type comprising as essential components at least one ferromagnetic metal, namely, iron, cobalt and/or nickel, and an oxide ceramic.

A group of amorphous alloys such as $Fe_{40}Ni_{40}P_{14}B_6$, $Fe_{80}B_{20}$ and $Fe_{78}Mo_2B_{20}$ are typical examples of conventional magnetic materials large in hardness and high in saturation magnetic induction. With respect to $Fe_{40}Ni_{40}P_{14}B_6$ by way of example, saturation magnetic induction is 7800 gauss, specific resistance is $180 \times 10^{-6}$ $\Omega$cm, Vickers hardness is 640 Hv, and magnetostriction constant is $31 \times 10^{-6}$.

These amorphous magnetic materials can be produced by rapid freezing of molten alloy composition, deposition by vacuum evaporation onto a cooled substrate, electrodeposition or electroless plating. Among these techniques, the most prevailing one is the rapid freezing method in which a molten alloy is instantaneously freezed by, for example, dropping the molten alloy onto a cooled body of cupper so that the molten alloy may solidify with the maintenance of liquid state arrangement of its atoms. In practice this method is classified into (a) gun method, (b) piston-and-anvil method, (c) torsion-catapult method, (d) centrifugal freezing method and (e) rolling method. However, the methods (a), (b) and (c) can provide the magnetic alloy only in the form of powder or films 1 to 50 $\mu$m in thickness and indefinite in shape. The products of the methods (d) and (e) are limited to ribbons 1 $\mu$m to 10 mm in width and 10 $\mu$m to 1 mm in thickness and, therefore, need to be subjected to machining.

Some of amorphous magnetic alloys such as $Fe_{80}B_{20}$ are produced by sputtering, but inconveniently there is the need of cooling the substrate with water to 60°-100° C. to avoid excessive heating of the deposited alloy.

Besides difficulties and troublesomeness in the production, these amorphous magnetic materials have a common disadvantage that annealing of these materials causes increase in coercive force due to relatively low crystallization temperatures and, therefore, are unsuitable for magnetic devices which undergo heating either during fabrication or in operation. Furthermore, these magnetic materials are not yet fully satisfactory in saturation magnetic induction values.

SUMMARY OF THE INVENTION

It is an object of the present invention to provide a novel magnetic material which has a large hardness and high resistances to heat, abrasion and corrosion, is excellent in magnetic properties particularly in saturation magnetic induction and coercive force, and can readily be produced in the form of thin film.

A magnetic material according to the invention is of cermet type and comprises as its essential components at least one ferromagnetic metal selected from Fe, Co and Ni and an oxide ceramic material.

SiO, $Al_2O_3$, $SiO_2$, MgO and $TiO_2$ are of use as a ceramic component of a magnetic material according to the invention, and the use of SiO or $Al_2O_3$ is preferred.

In a fundamental form, a magnetic material according to the invention consists essentially of the ferromagnetic metal (s) and an oxide ceramic. The proportion of the total number of the ferromagnetic metal atoms to the number of oxide molecules preferably ranges from 60:40 to 98:2.

As a modification, a cermet type magnetic material according to the invention may further comprise at least one element selected from Si, B, P and C. As another modification, this magnetic material may comprise Cr and/or Mn in place of, or in addition to, Si, B, P and/or C.

By way of example, a magnetic material according to the invention can be deposited on a substrate as a thin film of an optionally determined shape by flash evaporation of a sintered and pulverized mixture of the metallic and ceramic components.

DESCRIPTION OF THE PREFERRED EMBODIMENTS

EXAMPLE 1—Thin Film of $Fe_{80}(SiO)_{20}$

Figures 1, 2:
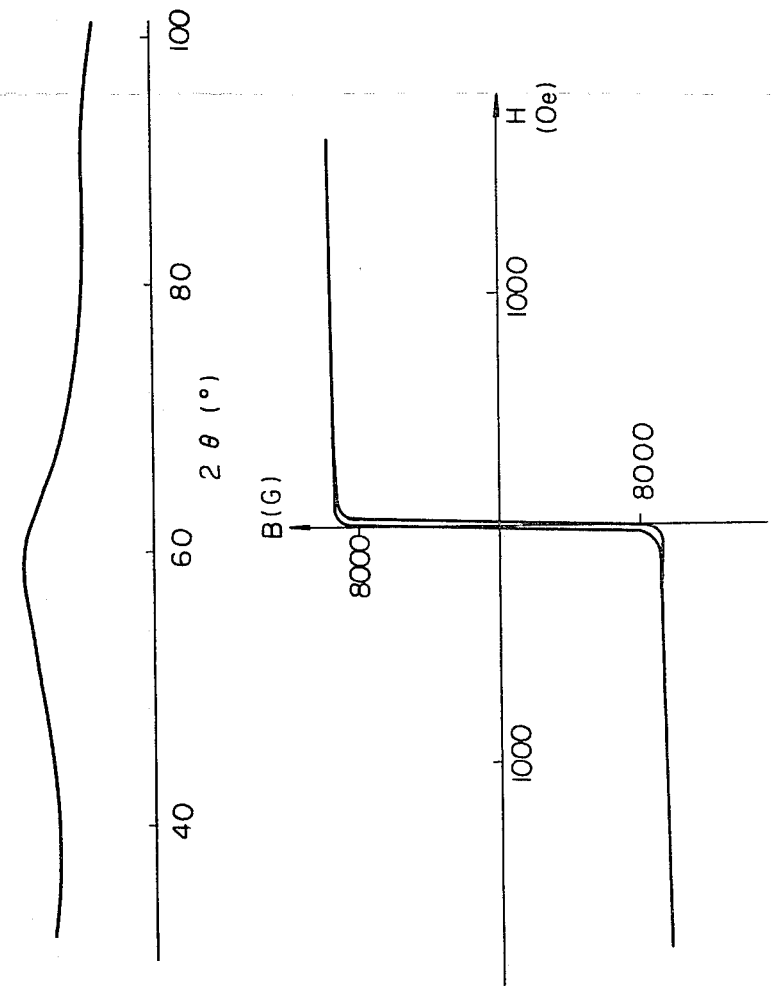
FIG. 1 is an X-ray diffraction pattern of a thin film of $Fe_{80}(SiO)_{20}$, an amorphous cermet magnetic material according to the invention.
FIGS. 2 and 3 are B-H curves for the magnetic material of FIG. 1 when magnetized by a DC current and at 1 KHz, respectively.

Finely powdered Fe (99.99% purity) and SiO (99.99% purity) were well mixed in such amounts that the proportion of the number of Fe atoms to the number of SiO molecules in the mixture was 80:20. This mixture was die-formed into pellets by the application of a pressure of 50-150 kg/cm² for a period of 5-10 min. The pellets were sintered at 600°-900° C. in a 0.5-1.0 kg/cm² argon gas atmosphere for 20-120 min and then pulverized into particles smaller than 0.6 mm. In a vacuum of $1-5 \times 10^{-5}$ torr, this powder was dropped onto a tungsten boat kept at a temperature of 1700° C. to cause instantaneous evaporation or flash evaporation of the powdered material. A glass plate used as a substrate was located above the tungsten boat at a distance of 7-40 cm therebetween and kept at a temperature of 100°-300° C. The evaporated material deposited on the surface of the glass substrate at a rate of 300-2500 Å (thickness of the deposited film)/sec, and the flash evaporation was continued until the deposition of a 1-20 $\mu$m thick film of $Fe_{80}(SiO)_{20}$ on the substrate. As shown in FIG. 1, X-ray diffraction revealed that the film thus formed was amorphous.

Figures 3, 4:
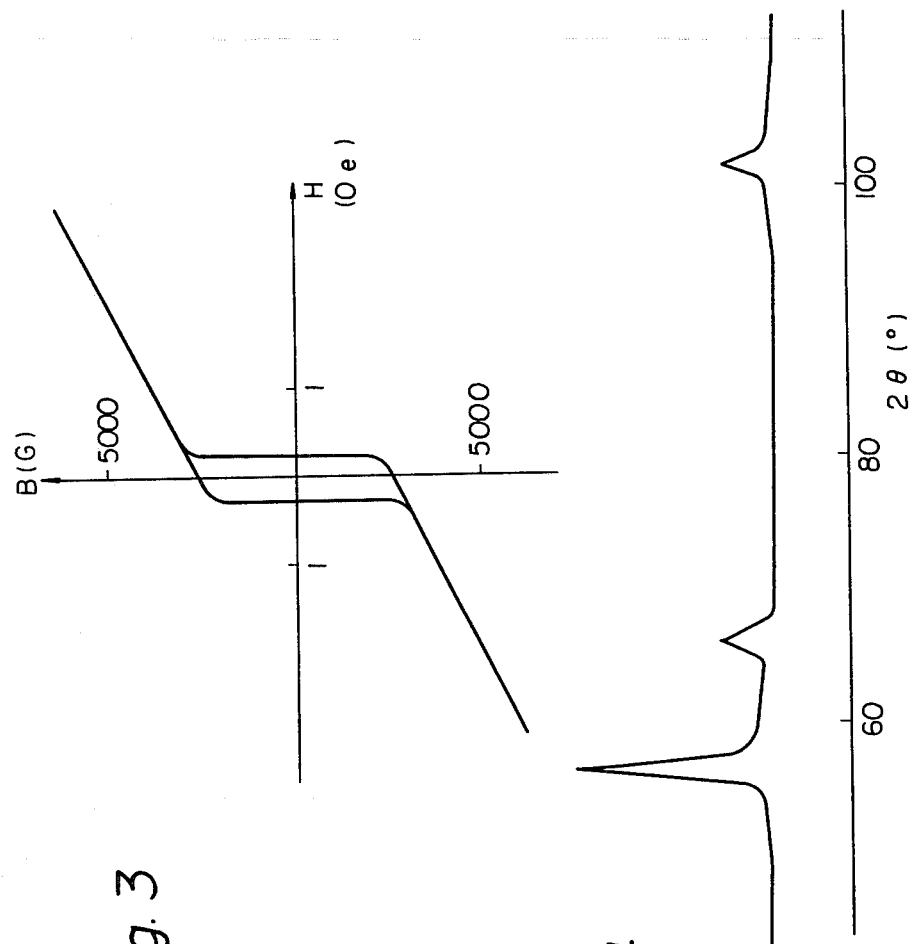
FIG. 4 is an X-ray diffraction pattern of a thin film of $Fe_{10}Ni_{70}(SiO)_{20}$, a polycrystalline cermet magnetic material according to the invention.

The hardness of this $Fe_{80}(SiO)_{20}$ film measured by a Vickers hardness tester was 700-750 Hv, and specific resistance was $25-32 \times 10^{-4}$ $\Omega$cm. Magnetization of this cermet film by a DC current gave the B-H curves of FIG. 2, where the saturation induction (Bs) was 8100-8800 gausss. When measured at an AC current of 1 KHz, the B-H curves were as shown in FIG. 3 and the coercive force (Hc) was 0.08-0.25 oersteds. The magnetic material produced in this example was far superior to conventional ferrites whose saturation induction is about 5000 gauss and $Fe_{40}Ni_{40}P_{14}B_6$ whose saturation induction is 7800 gauss. As to specific resistance, this magnetic material was lower than ferrites (0.1-0.4 $\Omega$cm) but was higher, approximately by a factor of 10, than conventional metallic magnetic materials such as Sendust ($1 \times 10^{-4}$ $\Omega$cm), Permalloy ($5 \times 10^{-4}$ $\Omega$cm) and $Fe_{40}Ni_{40}P_{14}B_6$ ($1.8\times10^{-4}$ Ωcm). Accordingly the magnetic material of this example is advantageous over the conventional metallic magnetic materials in applications where eddy current loss is a matter of importance. Besides, thin film formation of $Fe_{80}(SiO)_{20}$ was far easier than that of $Fe_{40}Ni_{40}P_{14}B_6$.

EXAMPLE 2—$Fe_{98}(SiO)_2$
EXAMPLE 3—$Fe_{60}(SiO)_{40}$
EXAMPLE 4—$Ni_{70}(SiO)_{30}$
EXAMPLE 5—$Co_{85}(SiO)_{15}$
EXAMPLE 6—$Fe_{75}Co_5(SiO)_{20}$
EXAMPLE 7—$Fe_{70}Ni_{10}(SiO)_{20}$
EXAMPLE 8—$Co_{65}Ni_{15}(SiO)_{20}$

In each of examples 2-8, a thin film of the above indicated cermet type magnetic material was formed fundamentally by the procedures of Example 1. The magnetic materials of Examples 2-8 were all amorphous. The magnetic properties of these materials and the products of the following Examples 9 and 10 are presented in Table 1.

EXAMPLE 9—$Fe_{10}Ni_{70}(SiO)_{20}$

A thin film of this material was formed fundamentally by the procedures of Example 1, but the glass substrate was kept at 340°-380° C. during evaporation of the magnetic material. The thin film formed in this example was a polycrystal as evidenced by the X-ray diffraction pattern of FIG. 4. The magnetic material of this example was characterized by an exceedingly large hardness, 950 Hv, and excellent heat resistance. Neither oxidation or an appreciable deterioration of magnetic properties occurred even when this material was heated to 300° C.

EXAMPLE 10—$Fe_{85}(Al_2O_3)_{15}$

Finely powdered Fe and $Al_2O_3$, both smaller than 5 μm in particle size, were well mixed in such amounts that the proportion of Fe atoms to $Al_2O_3$ molecules in the mixture was 85:15. The mixture was compacted in a die by the application of a pressure of 500 kg/cm² for a period of 2 hr, and the compacted body was sintered at a temperature of 1200°-1300° C. in a 2 kg/cm² argon gas atmosphere. The sintered body was a magnetic cermet having an exceedingly large hardness, 980 Hv, and excellent resistances to heat and oxidation.

As demonstrated by Examples 1-10, the addition of an oxide ceramic such as SiO or $Al_2O_3$ to Fe, Co and/or Ni gives a cermet type magnetic material excellent in saturation induction and coercive force. In view of variations in saturation induction and coercive force, it is most preferable that the proportion of the total number of the ferromagnetic metal atoms to the number of oxide molecules in a cermet type material according to the invention ranges from 60:40 to 98:2. The products of Examples 2-10 were also high in specific resistance than conventional metallic magnetic materials such as Sendust, Permalloy and $Fe_{40}Ni_{40}P_{14}B_6$.

We have confirmed that a cermet type material according to the invention becomes lower in coercive force with the maintenance of high saturation induction when it contains at least one of Si, B, P and C, which are called glass-forming elements, in addition to the essential metallic and ceramic components. In this case, it is preferable that the total number of Si, B, P and/or C atoms is in the range from 0.1 to 38% of the total number of these atoms, ferromagnetic metal atoms and oxide molecules in the cermet type magnetic material, while the proportion of the ferromagnetic metal atoms to the oxide molecules ranges from 60:40 to 98:2. The following Examples 11-25 illustrate magnetic materials containing Si, B, P or C.

EXAMPLE 11—$Fe_{80}Si_5(SiO)_{15}$
EXAMPLE 12—$Fe_{67}Si_3(SiO)_{30}$
EXAMPLE 13—$Fe_{60}Si_{38}(SiO)_2$
EXAMPLE 14—$Fe_{60}Si_{0.1}(SiO)_{39.9}$
EXAMPLE 15—$Fe_{97}Si_1(SiO)_2$
EXAMPLE 16—$Fe_{70}B_{20}(SiO)_{10}$
EXAMPLE 17—$Fe_{85}Si_5B_5(SiO)_5$
EXAMPLE 18—$Fe_{85}Si_{9.7}B_{0.3}(SiO)_5$
EXAMPLE 19—$Fe_5Co_{70}B_{10}(SiO)_{15}$
EXAMPLE 20—$Ni_{70}Si_5(SiO)_{25}$
EXAMPLE 21—$Fe_{70}Ni_{10}Si_5(SiO)_{15}$

In each of examples 11-21, a mixture of the ingredients was sintered at 500°-800° C., and a thin film of a cermet type magnetic material was formed by a flash evaporation method as described in Example 1, wherein the sintered and pulverized material was dropped onto a tungsten boat kept at 1750°-1800° C. The thin films formed in these examples were all amorphous. The magnetic properties of the products of Examples 11-21 and the following Examples 22-25 are presented in Table 2.

EXAMPLE 22—$Fe_{80}(SiO)_{10}P_{10}$

A 80:10 mixture (by numbers of atoms and molecules) of finely powdered Fe and SiO was sintered, pulverized and subjected to flash evaporation in accordance with Example 1. Simultaneously, red phosphorous powder was subjected to flash evaporation using another tungsten boat to cause simultaneous deposition of Fe-SiO and P on the same substrate, i.e. to accomplish two-source flash evaporation. The rate of evaporation of Fe-SiO and that of P were controlled such that Fe:(SiO):P = 80:10:10 in the thin film formed on the substrate, using two sets of quartz type film thickness gauges. The thin film formed in this example was amorphous.

EXAMPLE 23—$Fe_{80}(SiO)_{10}C_{10}$

A thin film of this material was formed by a sort of two-source evaporation method, wherein Fe-SiO was evaporated in accordance with Example 22, but evapo- Table 1

| | Substrate Temperature (°C.) | Coercive Force (oersteds) | Saturation Induction (gauss) |
|---|---|---|---|
| Example 2 $Fe_{98}(SiO)_2$ | 100-300 | 0.5-0.8 | 9200-9800 |
| Example 3 $Fe_{60}(SiO)_{40}$ | 100-300 | 0.1-0.3 | 5200-5900 |
| Example 4 $Ni_{70}(SiO)_{30}$ | 80-200 | 0.03-0.05 | 4000-4800 |
| Example 5 $Co_{85}(SiO)_{15}$ | 150-300 | 0.4-0.7 | 6500-7400 |
| Example 6 $Fe_{75}Co_5(SiO)_{20}$ | 120-300 | 0.1-0.3 | 8000-8600 |
| Example 7 $Fe_{70}Ni_{10}(SiO)_{20}$ | 150-300 | 0.08-0.2 | 6800-7200 |
| Example 8 $Co_{65}Ni_{15}(SiO)_{20}$ | 120-300 | 0.1-0.3 | 5300-5800 |
| Example 9 $Fe_{10}Ni_{70}(SiO)_{20}$ | 340-380 | 0.04-0.07 | 3500-3900 |
| Example 10 $Fe_{85}(Al_2O_3)_{15}$ | | 0.6-1.1 | 3500-4200 |
| $Fe_{50}(SiO)_{50}$ (for reference) | 100-300 | 2-5 | 600-680 | ration of C was achieved by the application of a voltage of 10–20 V and a current of 30–60A to a pair of carbon rods which were pressed against each other at their pointed tips.

EXAMPLE 24—$Fe_{70}B_{20}(SiO)_{10}$

This example was fundamentally similar to Example 16, but the temperature of the substrate in the flash evaporation was raised to 300°–350° C. The thin film formed in this example was partly polycrystalline and partly amorphous. This film was lower in cercive force than the product of Example 16 as can be seen in Table 2 and was superior to the latter also in heat resistance.

EXAMPLE 25—$Fe_{80}Si_5(SiO)_{15}$

This material was identical with the product of Example 11 in composition. In this example, the magnetic material was produced in the form of a cylindrically shaped and sintered body. A powdery mixture of Fe, Si and SiO (each smaller than 37 μm in particle size) was compacted in a die by the application of a pressure of 500 kg/cm² for a period of 2 hr, and the compacted body was sintered at 950°–1050° C. in a 2 kg/cm² argon gas atmosphere for 2–4 hr.

The cermet type magnetic materials produced in Examples 11–25 were all higher in specific resistance than Sendust, Permalloy and $Fe_{40}Ni_{40}P_{14}B_6$. For example, the specific resistance of $Fe_{80}Si_5(SiO)_{15}$ (Example 11) was $27-34\times 10^{-4}$ Ωcm, and that of $Fe_{70}B_{20}(SiO)_{10}$ (Example 16) was $43-50\times 10^{-4}$ Ωcm.

Table 2

| | Substrate Temperature (°C.) | Coercive Force (oersteds) | Saturation Induction (gauss) |
|---|---|---|---|
| Example 11 $Fe_{80}Si_5(SiO)_{15}$ | 100–300 | 0.04–0.1 | 5100–5600 |
| Example 12 $Fe_{67}Si_3(SiO)_{30}$ | 100–300 | 0.08–0.3 | 4600–5200 |
| Example 13 $Fe_{60}Si_{38}(SiO)_2$ | 100–300 | 0.2–0.4 | 2800–3100 |
| Example 14 $Fe_{60}Si_{0.1}(SiO)_{39.9}$ | 100–300 | 0.07–0.2 | 4200–4700 |
| Example 15 $Fe_{97}Si_1(SiO)_2$ | 100–300 | 0.6–1.0 | 8900–9300 |
| Example 16 $Fe_{70}B_{20}(SiO)_{10}$ | 100–300 | 0.3–0.6 | 4100–4700 |
| Example 17 $Fe_{85}Si_5B_5(SiO)_5$ | 100–300 | 0.03–0.08 | 7400–7700 |
| Example 18 $Fe_{85}Si_{9.7}B_{0.3}(SiO)_5$ | 100–300 | 0.05–0.1 | 7800–8200 |
| Example 19 $Fe_5Co_{70}B_{10}(SiO)_{15}$ | 150–300 | 0.1–0.3 | 5200–5700 |
| Example 20 $Ni_{70}Si_5(SiO)_{25}$ | 80–200 | 0.01–0.03 | 4200–4800 |
| Example 21 $Fe_{70}Ni_{10}Si_5(SiO)_{15}$ | 100–300 | 0.02–0.05 | 4800–5300 |
| Example 22 $Fe_{80}(SiO)_{10}P_{10}$ | 50–150 | 0.08–0.2 | 6800–7400 |
| Example 23 $Fe_{80}(SiO)_{10}C_{10}$ | 100–300 | 0.09–0.3 | 7100–7600 |
| Example 24 $Fe_{70}B_{20}(SiO)_{10}$ | 300–350 | 0.1–0.3 | 3900–4200 |
| Example 25 $Fe_{80}Si_5(SiO)_{15}$ | | 0.06–0.13 | 4600–5200 |
| $Fe_{80}Si_{20}$ | 100–300 | 6–8 | 6200–6800 |
| $Fe_{50}Si_{45}(SiO)_5$ | 100–300 | 3–7 | 750–830 |
| $Fe_{50}B_{25}(SiO)_{25}$ | 100–300 | | <100 |
| $Fe_{70}B_{30}$ | 100–300 | 20–30 | 5200–5600 |

Furthermore, we have confirmed that a cermet type magnetic material excellent in saturation induction and coercive force and also in abrasion resistance can be obtained by the addition of at least one of a group of metal elements such as Cr and Mn, which belong to 3d transition metal elements and are characterized by exhibiting antiferromagnetism in elemental form but exhibiting ferromagnetism in alloys, to the hereinbefore described essential combination of at least one ferromagnetic metal and an oxide ceramic. In this case, it is preferable that the total number of Cr and/or Mn atoms is in the range from 0.1 to 38% of the total number of these atoms, ferromagnetic metal atoms and oxide molecules in the cermet type magnetic material. Also in this case, the proportion of the ferromagnetic metal atoms to the oxide molecules is made to range from 60:40 to 98:2. The following Examples 26–33 illustrate cermet type magnetic materials containing Cr and/or Mn.

EXAMPLES 26–33

Cermet type magnetic materials shown in Table 3 were produced each in the form of a thin film on a glass substrate by sintering a mixture of powdery raw materials at 500°–800° C., pulverizing the sintered mixture and subjecting the sintered and pulverized material to flash evaporation by dropping onto a tungsten boat heated to 1750°–1800° C. In Example 30, the thin film was annealed for 2–3 hr at 300°–400° C.

Table 3

| | Substrate Temperature (°C.) | Coercive Force (oersteds) | Saturation Induction (gauss) |
|---|---|---|---|
| Example 26 $Fe_{80}Cr_{10}(SiO)_{10}$ | 100–300 | 0.03–0.05 | 8100–8500 |
| Example 27 $Fe_{60}Cr_{38}(SiO)_2$ | 100–300 | 2–5 | 3200–3600 |
| Example 28 $Fe_{90}Cr_{0.1}(SiO)_{9.9}$ | 100–300 | 0.9–1.5 | 8600–9000 |
| Example 29 $Fe_{60}Cr_1(SiO)_{39}$ | 100–300 | 1–3 | 3100–3500 |
| Example 30 $Fe_{75}Co_{10}Cr_5(SiO)_{10}$ | 100–300 | 0.06–0.09 | 7600–8100 |
| Example 31 $Fe_{70}Ni_{10}Cr_5(SiO)_{15}$ | 150–300 | 0.02–0.06 | 6200–6600 |
| Example 32 $Fe_{80}Mn_7(SiO)_{13}$ | 100–300 | 0.02–0.05 | 8300–8700 |
| Example 33 $Fe_{80}Cr_5Mn_5(SiO)_{10}$ | 100–300 | 0.01–0.04 | 8100–8500 |
| $Fe_{50}Cr_{40}(SiO)_{10}$ | 100–300 | 4–10 | 600–900 |

The addition of Cr and/or Mn to the essential combination of at least one ferromagnetic metal and an oxide ceramic can be done together with the hereinbefore described addition of Si, B, P and/or C. The resultant cermet type magnetic materials are also excellent in saturation induction, coercive force, heat resistance and abrasion resistance.

Other than the flash evaporation methods used in the foregoing examples, various kinds of known thin film forming methods such as sputtering, multi-source evaporation, ion plating, molecular beam evaporation and laser evaporation are applicable to the production of a cermet type magnetic material according to the invention. Furthermore, a magnetic material according to the invention can be produced in various forms other than thin film by sintering as demonstrated in Examples 10 and 25 or by a different method. A magnetic material according to the invention is of use for magnetic heads and other various types of magnetic-electric transducer elements.

What is claimed is:

1. A magnetic material which comprises SiO and at least one ferromagnetic metal selected from the group consisting of Fe, Co, and Ni, and takes the form of a thin film of an amorphous cermet grown on a surface of a substrate by simultaneous vacuum evaporation of SiO and said at least one ferromagnetic metal, the proportion of the total number of the atoms of said at least one ferromagnetic metal in said film to the number of the molecules of SiO in said film being in the range from 60:40 to 98:2.

2. A magnetic material which comprises SiO, at least one ferromagnetic metal selected from the group consisting of Fe, Co, and Ni, and at least one additional element selected from the group consisting of Si, B, P, and C, and takes the form of a thin film grown on a surface of a substrate by simultaneous vacuum evaporation of SiO, said at least one ferromagnetic metal and said at least one additional element, the proportion of the total number of the atoms of said at least one ferromagnetic metal in said film to the number of the molecules of SiO in said film being in the range from 60:40 to 98:2, the total number of the atoms of said at least one additional element in said film being in the range from 0.1 to 38% of the total number of the atoms of said at least one ferromagnetic metal, molecules of SiO and atoms of said at least one additional element in said film.

3. A magnetic material which comprises SiO, at least one ferromagnetic metal selected from the group consisting of Fe, Co, and Ni, and at least one additional element selected from the group consisting of Cr and Mn, the proportion of the total number of the atoms of said at least one ferromagnetic metal in said film to the number of the molecules of SiO in said film being in the range from 60:40 to 98:2, the total number of the atoms of said at least one additional element in said film being in the range from 0.1 to 38% of the total number of the atoms of said at least one ferromagnetic metal, molecules of SiO and atoms of said at least one additional element in said film.

* * * * *